United States Patent
Kondo et al.

(10) Patent No.: US 12,418,161 B2
(45) Date of Patent: Sep. 16, 2025

(54) LIGHT EMITTING APPARATUS AND INFORMATION PROCESSING APPARATUS

(71) Applicant: FUJIFILM Business Innovation Corp., Tokyo (JP)

(72) Inventors: Takashi Kondo, Kanagawa (JP); Junichiro Hayakawa, Kanagawa (JP); Takafumi Higuchi, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 939 days.

(21) Appl. No.: 17/541,205

(22) Filed: Dec. 2, 2021

(65) Prior Publication Data

US 2023/0011306 A1  Jan. 12, 2023

(30) Foreign Application Priority Data

Jul. 8, 2021  (JP) ................. 2021-113398

(51) Int. Cl.
*H01S 5/42* (2006.01)
*G01B 11/24* (2006.01)

(52) U.S. Cl.
CPC .............. *H01S 5/423* (2013.01); *G01B 11/24* (2013.01)

(58) Field of Classification Search
CPC ..... H01S 5/423; H01S 5/04256; G01B 11/24; H01L 25/167; G01S 7/4815; G01S 17/08; G01S 7/484; G01S 7/4911; G01S 17/894
See application file for complete search history.

(56) References Cited

U.S. PATENT DOCUMENTS

| 6,259,715 B1 | 7/2001 | Nakayama |
| 10,468,853 B2 | 11/2019 | Kondo |
| 12,027,510 B2 | 7/2024 | Kondo et al. |
| 2020/0249318 A1* | 8/2020 | Henderson ............ G01S 7/4814 |
| 2020/0301011 A1* | 9/2020 | Niinami ................ G01S 7/4915 |
| 2022/0158418 A1* | 5/2022 | Satoh ...................... G01S 17/10 |

FOREIGN PATENT DOCUMENTS

| CN | 111149226 A | * | 5/2020 | ........... H01S 5/0014 |
| JP | H1168230 | | 3/1999 | |
| JP | 2018006502 | | 1/2018 | |
| JP | 2020155403 | | 9/2020 | |
| JP | 2020161554 | | 10/2020 | |
| JP | 2021071478 | | 5/2021 | |

OTHER PUBLICATIONS

Machine translation of CN-111149226-A (Year: 2020).*
"Office Action of Japan Counterpart Application", issued on Feb. 12, 2025, with English translation thereof, p. 1-p. 6.

* cited by examiner

*Primary Examiner* — Yuanda Zhang
(74) *Attorney, Agent, or Firm* — JCIPRNET

(57) ABSTRACT

A light emitting apparatus includes a substrate and light emitting elements including at least one light emitting element that is provided, on the substrate, in each region of plural regions and that emits irradiation light toward a target object, the regions including a first region and a second region and being isolated from each other to be arranged one-dimensionally or two-dimensionally. In the plural regions, an irradiation light amount of at least one light emitting element provided in the first region that is a region located at an end in an arrangement direction is larger than an irradiation light amount of at least one light emitting element provided in the second region that is a region located at a place other than the end in the arrangement direction.

12 Claims, 10 Drawing Sheets

LIGHT EMITTING APPARATUS AND INFORMATION PROCESSING APPARATUS

CROSS-REFERENCE TO RELATED APPLICATIONS

This application is based on and claims priority under 35 USC 119 from Japanese Patent Application No. 2021-113398 filed Jul. 8, 2021.

BACKGROUND

(i) Technical Field

The present disclosure relates to a light emitting apparatus and an information processing apparatus.

(ii) Related Art

Japanese Unexamined Patent Application Publication No. 2018-006502 describes a light emitting component in which reduction in characteristics of an element used for light emission is suppressed as compared with a case of using a substrate on which a semiconductor stack body constituting an element used for light emission is grown on a semiconductor stack body constituting an element used for driving.

SUMMARY

In the related art, a time of flight (ToF) three-dimensional sensor has been used to perform three-dimensional measurement of a target object.

In this case, when irradiation light amounts for the target object from plural light emitting elements included in a light emitting apparatus are substantially equal, in a reflection light amount from the target object received by the three-dimensional sensor as a light receiving unit, a light amount difference is generated between an inner portion and an outer portion in a direction crossing an irradiation direction. This case has room for improvement because the accuracy of three-dimensional measurement of the target object is decreased because the reflection light amount of the outer portion in the crossing direction received by the three-dimensional sensor is smaller than the reflection light amount of the inner portion in the crossing direction.

Aspects of non-limiting embodiments of the present disclosure relate to, in a configuration capable of light emission in units of regions on a substrate on which light emitting elements are provided, suppressing variations in the reflection light amount from the target object received by the light receiving unit as compared with a case where irradiation light amounts for the target object from the regions are substantially equal.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light emitting apparatus including a substrate and light emitting elements including at least one light emitting element that is provided, on the substrate, in each region of plural regions and that emits irradiation light toward a target object, the regions including a first region and a second region and being isolated from each other to be arranged one-dimensionally or two-dimensionally, wherein in the plural regions, an irradiation light amount of at least one light emitting element provided in the first region that is a region located at an end in an arrangement direction is larger than an irradiation light amount of at least one light emitting element provided in the second region that is a region located at a place other than the end in the arrangement direction.

BRIEF DESCRIPTION OF THE DRAWINGS

Exemplary embodiments of the present disclosure will be described in detail based on the following figures, wherein.

DETAILED DESCRIPTION

First Exemplary Embodiment

Figure 1:
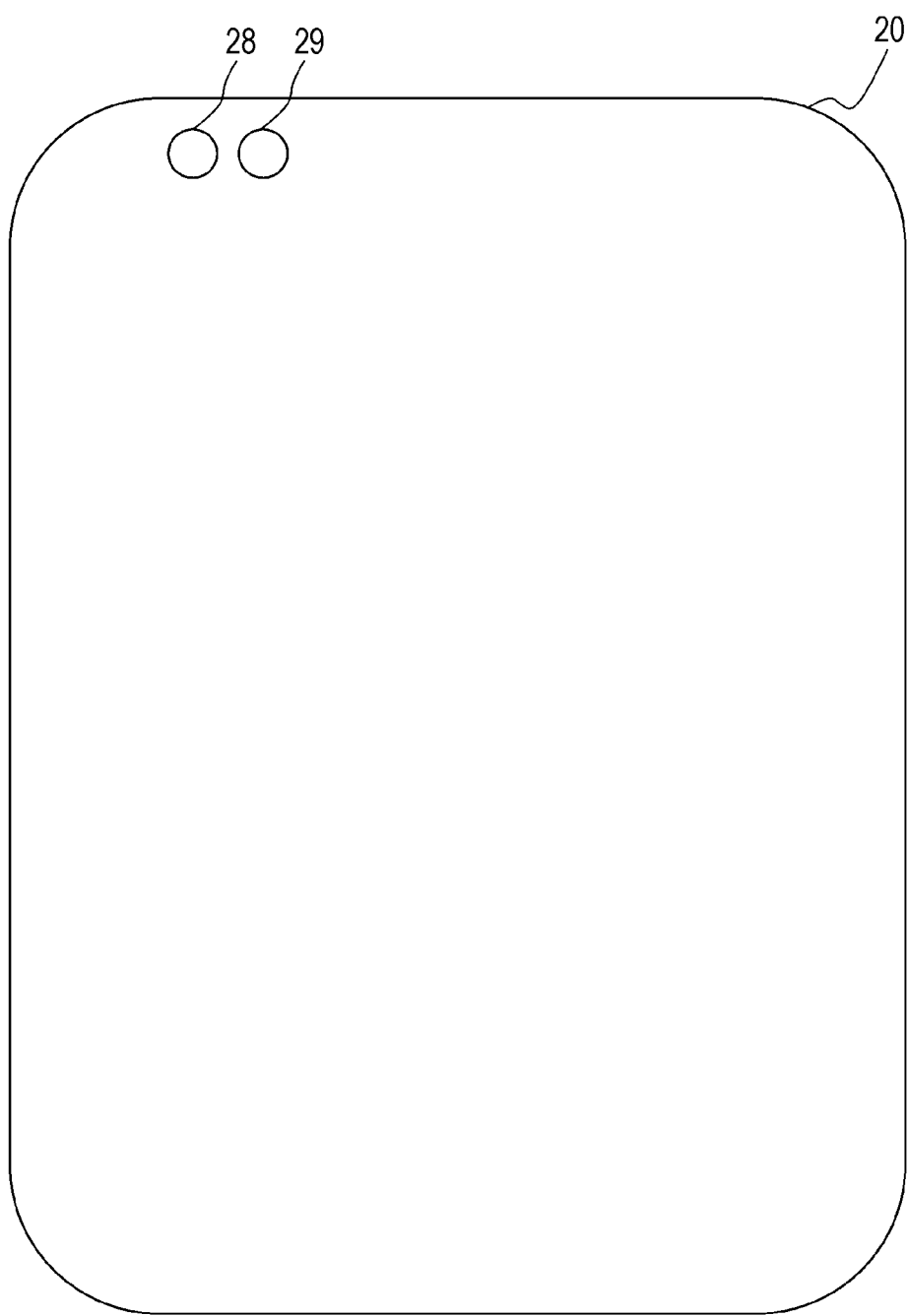
FIG. 1 illustrates an external appearance of a back surface of an information processing apparatus.

FIG. 1 illustrates an external appearance of a back surface of an information processing apparatus 20. As an example, a general-purpose computer apparatus such as a server computer or a personal computer (PC) or a mobile terminal such as a smartphone or a tablet terminal is applied to the information processing apparatus 20. In a first exemplary embodiment, the information processing apparatus 20 is a "smartphone".

As illustrated in FIG. 1, the information processing apparatus 20 includes, as an example, a light emitting apparatus 28 and a three-dimensional sensor (hereinafter referred to as "3D sensor 29") provided in an upper part of the back surface. Details of each component will be described later.

As an example, the information processing apparatus 20 determines a three-dimensional shape of a target object, specifically a human face, by using the light emitting apparatus 28 and the 3D sensor 29. In the first exemplary embodiment, description is made by giving the "human face" an example of the target object.

Figure 2:
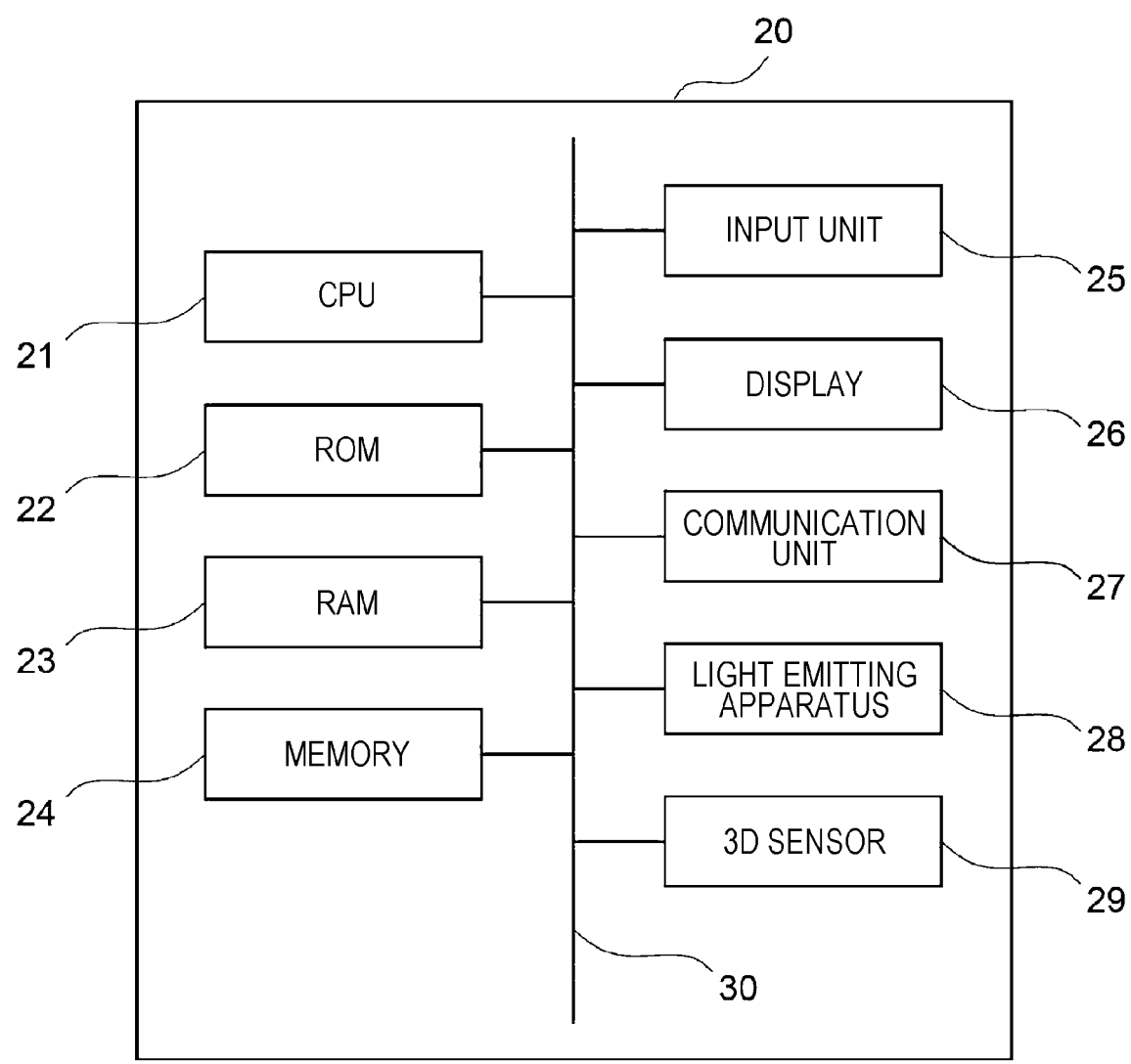
FIG. 2 is a block diagram illustrating a hardware configuration of the information processing apparatus.

FIG. 2 is a block diagram illustrating a hardware configuration of the information processing apparatus 20. As illustrated in FIG. 2, the information processing apparatus 20 includes a central processing unit (CPU) 21, a read only memory (ROM) 22, a random access memory (RAM) 23, a memory 24, an input unit 25, a display 26, a communication unit 27, the light emitting apparatus 28, and the 3D sensor 29. The components are communicably connected to one another via a bus 30.

The CPU 21 is a central arithmetic processing unit and executes various programs or controls each unit. That is, the CPU 21 reads a program from the ROM 22 or the memory 24 and executes the program by using the RAM 23 as a work area. In accordance with the program stored in the ROM 22 or the memory 24, the CPU 21 controls the above components or performs various types of arithmetic processing. The CPU 21 is an example of a "determination unit".

The ROM 22 stores various programs and various types of data. The RAM 23 temporarily stores a program or data as a work area.

The memory 24 is constituted by a storage device such as a hard disk drive (HDD), a solid state drive (SSD), or a flash memory and stores various programs and various types of data.

The input unit 25 includes, as an example, various buttons, a microphone, a camera, and the like and is used for inputting various types of information.

The display 26 is a liquid crystal display as an example and displays various types of information. Since a touch panel is employed, the display 26 also functions as the input unit 25.

The communication unit 27 is an interface for communication with another equipment. For the communication, for example, a wired communication standard such as Ethernet (registered trademark) or Fiber Distributed Data Interface (FDDI) or a wireless communication standard such as 4G, 5G, or Wi-Fi (registered trademark) is used.

The light emitting apparatus 28 is a part that emits irradiation light toward a human face in order to acquire a three-dimensional image thereof. The light emitting apparatus 28 in the first exemplary embodiment is constituted as a light emitting element array on which light emitting elements are arranged two-dimensionally. Each of the light emitting elements is, as an example, a vertical cavity surface emitting laser (VCSEL). In the following description, the light emitting element is the VCSEL. That is, the VCSEL is an example of the "light emitting element".

The irradiation light emitted from the light emitting apparatus 28 is reflected on a human face and returns as reflection light. The 3D sensor 29 receives the reflection light. The 3D sensor 29 is an example of a "light receiving unit". As an example, the 3D sensor 29 has a function of acquiring a three-dimensional image of the human face on the basis of so-called time of flight (ToF).

Here, the 3D sensor 29 includes plural light receiving regions (pixels). The 3D sensor 29 receives the reflection light from the human face, resulting from the irradiation light from the light emitting apparatus 28, and accumulates charge corresponding to a time until reception of the reflection light for each light receiving region. Subsequently, the 3D sensor 29 outputs a signal corresponding to the time from when the irradiation light is emitted from the light emitting apparatus 28 until when the 3D sensor 29 receives the reflection light.

Subsequently, the CPU 21 acquires the signal output from the 3D sensor 29, calculates a distance to the human face for each light receiving region of the 3D sensor 29, and determines a three-dimensional shape of the human face. Subsequently, as an example, if the determined three-dimensional shape of the human face matches a three-dimensional shape that is stored in the memory 24 in advance, the CPU 21 permits use of the information processing apparatus 20 including various applications and the like provided by the information processing apparatus 20.

Figure 3:
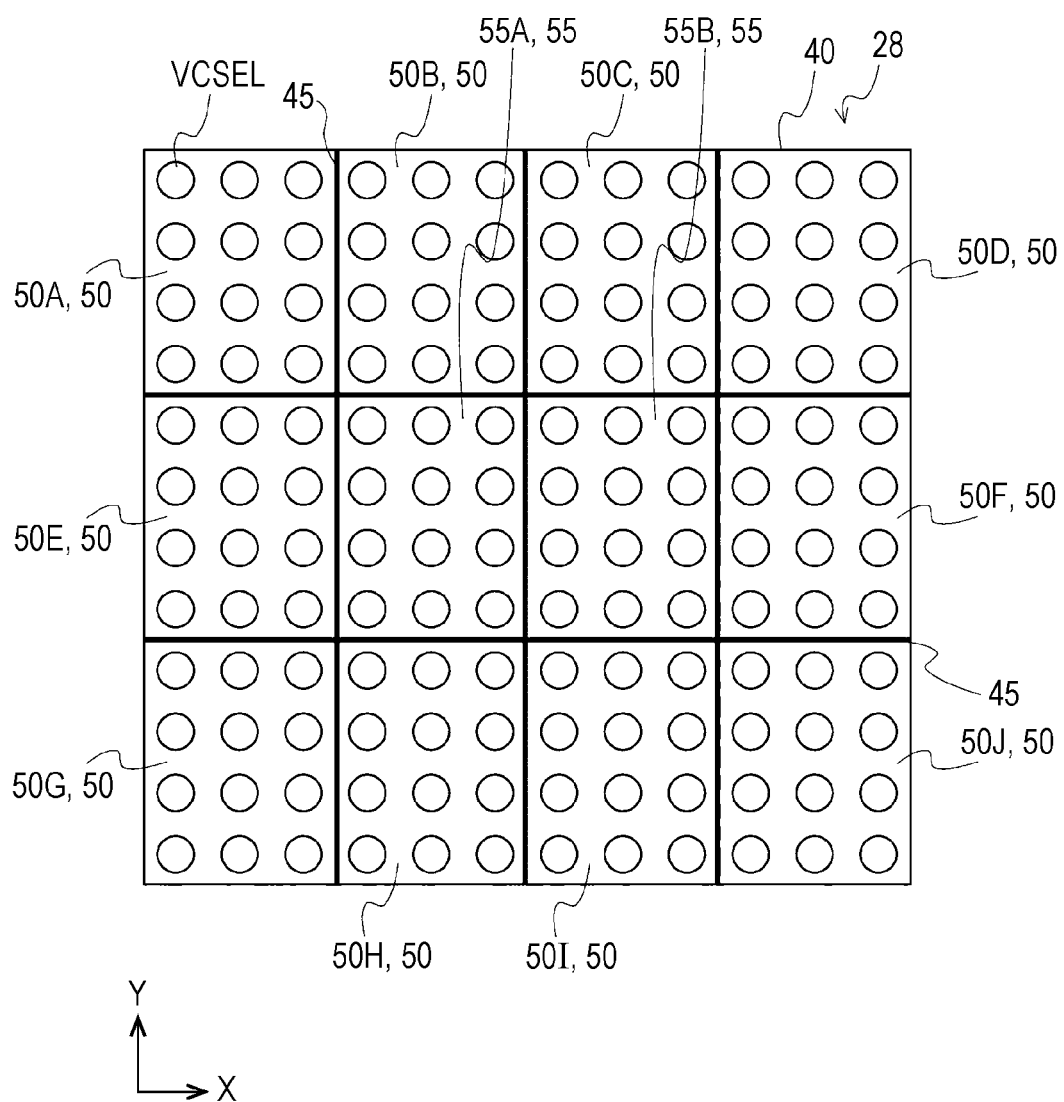
FIG. 3 is a first plan view of the light emitting apparatus.

FIG. 3 is a first plan view of the light emitting apparatus 28. As an example, FIG. 3 illustrates, as the configuration of the light emitting apparatus 28, a substrate 40 and plural VCSELs that are arranged two-dimensionally on the substrate 40.

In addition, as illustrated in FIG. 3, on the substrate 40, isolation trenches 45 that extend in the horizontal direction (hereinafter referred to as "X direction") and the vertical direction (hereinafter referred to as "Y direction") of the substrate 40 are formed. As an example, the isolation trenches 45 are formed by performing etching processing on the substrate 40. By the trenches formed on the substrate 40, that is, the isolation trenches 45, the light emitting apparatus 28 is isolated into 12 regions as a whole, which are four regions in the X direction and three regions in the Y direction. In addition, the isolation trenches 45 are subjected to insulation processing. Thus, in the light emitting apparatus 28, the isolation trenches 45 physically isolate the regions from each other and insulate adjacent regions. Note that the X direction and the Y direction in the first exemplary embodiment are each an example of an "arrangement direction".

Hereinafter, among the 12 regions of the light emitting apparatus 28, regions located at ends in the X direction or the Y direction are referred to as "first regions 50", and regions located at places other than the ends in the X direction or the Y direction are referred to as "second regions 55". As illustrated in FIG. 3, the first regions 50 are constituted by 10 regions, which are a first region 50A to a first region 50J, and the second regions 55 are constituted by 2 regions, which are a second region 55A and a second region 55B.

In addition, as illustrated in FIG. 3, plural VCSELs are provided in each of the regions in the first regions 50 and the second regions 55. As an example, in FIG. 3, 12 VCSELs are provided in each of the regions.

Here, in the light emitting apparatus 28, irradiation light amounts of the VCSELs provided in each of the regions in the first regions 50 and the second regions 55 are controlled by using driving current that flows in the regions. In addition, to the light emitting apparatus 28, a driving circuit (hereinafter referred to as "driver"), which is not illustrated, is connected, and the driver controls the driving current that flows in each of the regions in the first regions 50 and the second regions 55. In addition, in the light emitting apparatus 28, the driving current flows in each of the regions under control of the driver, and the VCSELs provided in the region emit the irradiation light toward a predetermined area of a human face.

Figure 4:
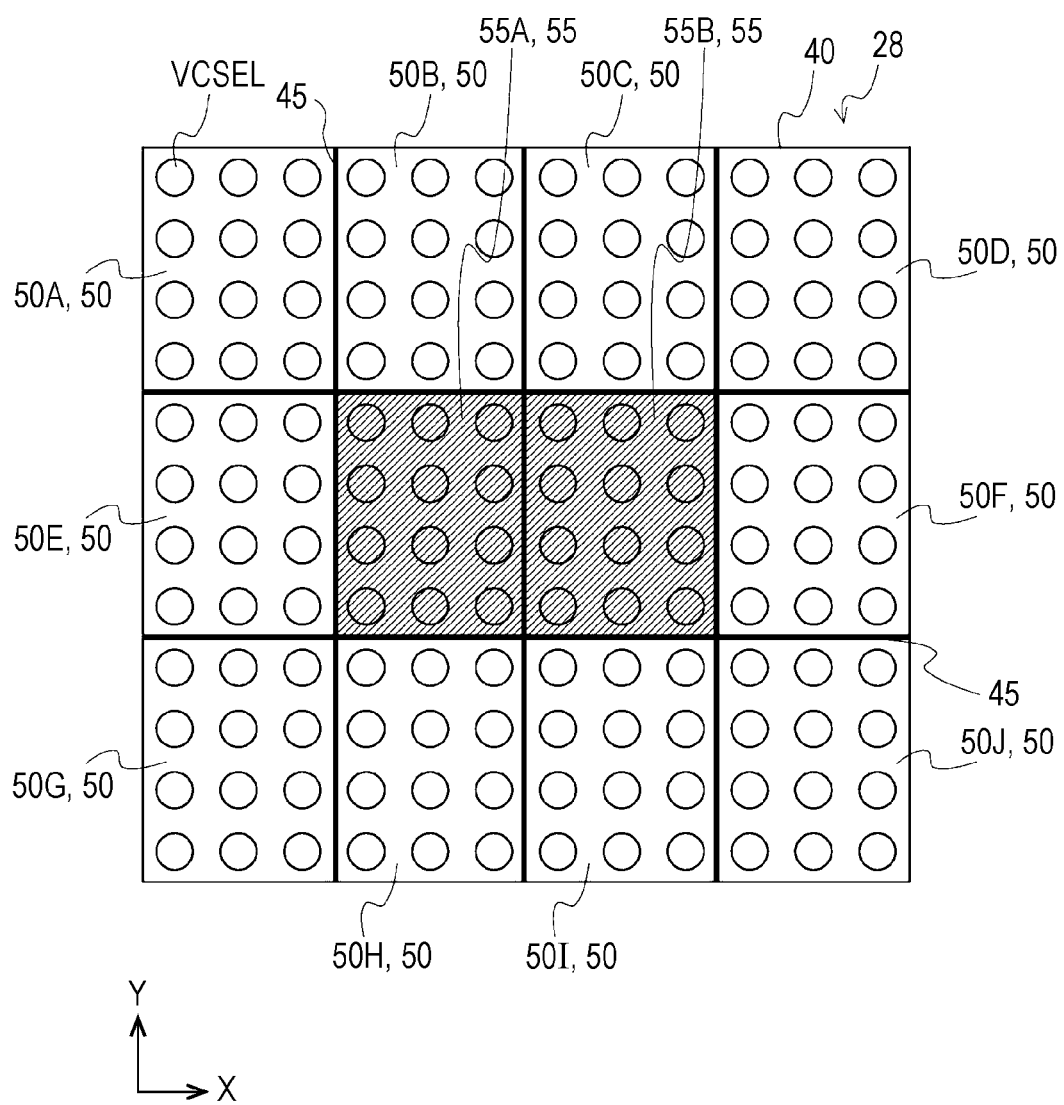
FIG. 4 is a second plan view of the light emitting apparatus.
Figure 5:
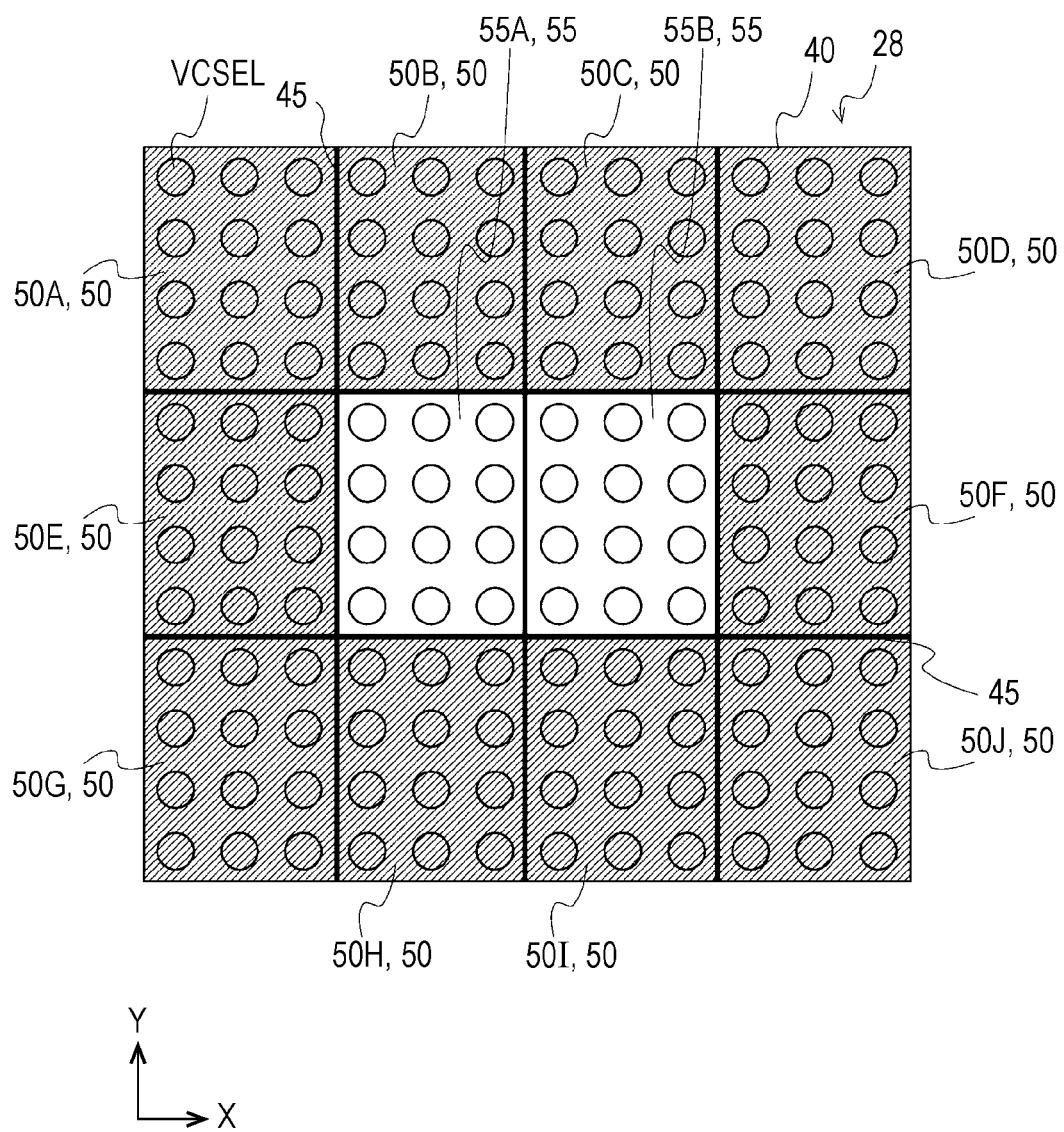
FIG. 5 is a third plan view of the light emitting apparatus.

FIG. 4 is a second plan view of the light emitting apparatus 28, and FIG. 5 is a third plan view of the light emitting apparatus 28. Note that regions emitting the irradiation light are hatched with right-up diagonal lines, and regions not emitting the irradiation light are white in FIGS. 4 and 5.

In the first exemplary embodiment, after the VCSELs provided in the second regions 55 emit the irradiation light toward a human face, the VCSELs provided in the first regions 50 emit the irradiation light toward the human face. Specifically, FIG. 4 illustrates emission of the irradiation light from the second region 55A and the second region 55B, and FIG. 5 illustrates emission of the irradiation light from the first region 50A to the first region 50J with the emission of the irradiation light from the second region 55A and the second region 55B stopped. With the above configuration, the light emitting apparatus 28 may emit the irradiation light from the VCSELs provided in each of the regions in the first regions 50 and the second regions 55 toward the human face at subsequent timings.

Here, in a case of three-dimensional measurement of a target object by using the three-dimensional sensor such as the 3D sensor 29 of the information processing apparatus 20, when irradiation light amounts for the target object from the plural light emitting elements included in the light emitting apparatus are substantially equal, in a reflection light amount from the target object received by the three-dimensional sensor, a light amount difference is generated between an inner portion and an outer portion in a direction crossing an irradiation direction, for example, the perpendicular direction of the irradiation direction. Specifically, in this case, the reflection light amount of the outer portion in the perpendicular direction received by the three-dimensional sensor is smaller than the reflection light amount of the inner portion in the perpendicular direction, and thus, the accuracy of the three-dimensional measurement of the target object is decreased.

In light of the above point, it is considered that the accuracy of the three-dimensional measurement of the target object is increased by providing, for the irradiation light to be emitted to the target object, a light amount difference in a manner that the irradiation light amount of the outer portion is the larger of the inner portion and the outer portion in the perpendicular direction that is perpendicular to the irradiation direction.

Thus, in the first exemplary embodiment, the irradiation light amount of the VCSELs provided in the first regions 50 is larger than the irradiation light amount of the VCSELs provided in the second regions 55. As an example, in the first exemplary embodiment, the driver changes the value of the driving current that flows in each of the regions in the first regions 50 and the second regions 55 to control the irradiation light amount of the VCSELs provided in a corresponding region. Thus, in first exemplary embodiment, it is possible to provide, for the irradiation light from the light emitting apparatus 28, a light amount difference in a manner that the irradiation light amount of the outer portion is the larger of the inner portion and the outer portion of the perpendicular direction that is perpendicular to the irradiation direction.

With the above configuration, according to the first exemplary embodiment, in a configuration capable of light emission in units of regions on a substrate on which light emitting elements are provided, variations in the reflection light amount from a human face that is the target object received by the 3D sensor 29 are suppressed as compared with a case where the irradiation light amounts for the target object from the regions are substantially equal. In addition, according to the first exemplary embodiment, by suppressing the variations in the reflection light amount, the three-dimensional shape of the human face that is the target object may be determined accurately.

Next, referring to the graphs illustrated in FIGS. 6A and 6B to FIG. 8, a relationship between the irradiation light from the light emitting apparatus 28 and the reflection light received by the 3D sensor 29 will be described.

Figure 6A:
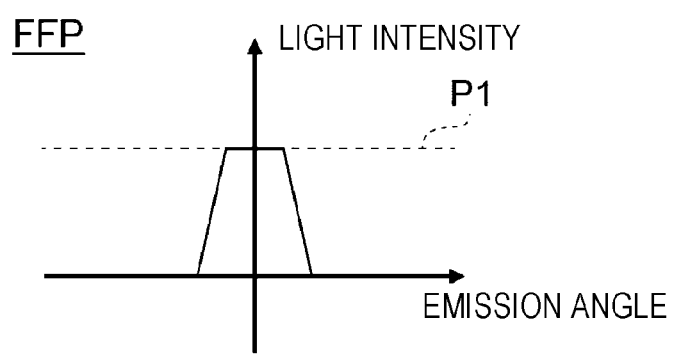
FIGS. 6A and 6B are each a first graph illustrating observation results of luminance distribution in a far field pattern (FFP)
Figure 6B:
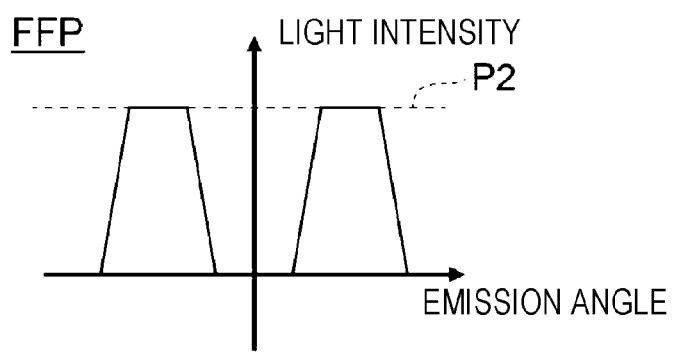

FIGS. 6A and 6B are each a first graph illustrating observation results of luminance distribution in a far field pattern (FFP). Specifically, FIG. 6A illustrates the observation results of the irradiation light from the VCSELs provided in the second regions 55 described with reference to FIG. 4, and FIG. 6B illustrates the observation results of the irradiation light from the VCSELs provided in the first regions 50 described with reference to FIG. 5. In addition, the vertical axis in the graphs in FIGS. 6A and 6B represents "light intensity", and the horizontal axis represents "emission angle".

As illustrated in FIGS. 6A and 6B, a peak light intensity P1 of the irradiation light from the VCSELs provided in the second regions 55 represented by a broken line is lower than a peak light intensity P2 of the irradiation light from the VCSELs provided in the first regions 50 represented by a broken line.

Figure 7:
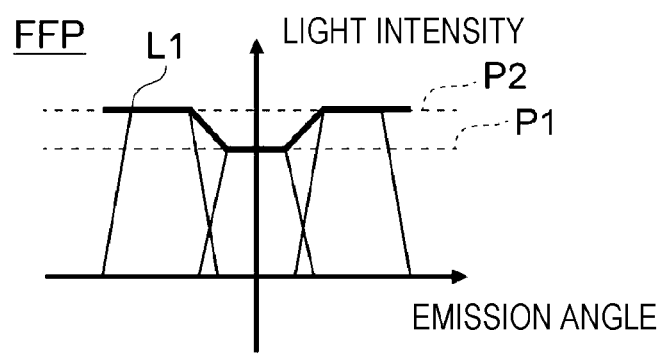
FIG. 7 is a second graph illustrating the observation results of the luminance distribution in the FFP.

FIG. 7 is a second graph illustrating the observation results of the luminance distribution in the FFP. Specifically, FIG. 7 illustrates results of combining the graphs in FIGS. 6A and 6B.

As illustrated in FIG. 7, a solid line L1 connecting the peak light intensity P1 and the peak light intensity P2 to each other is a curve in which a center portion is bent to be lower than the end portions.

Figure 8:
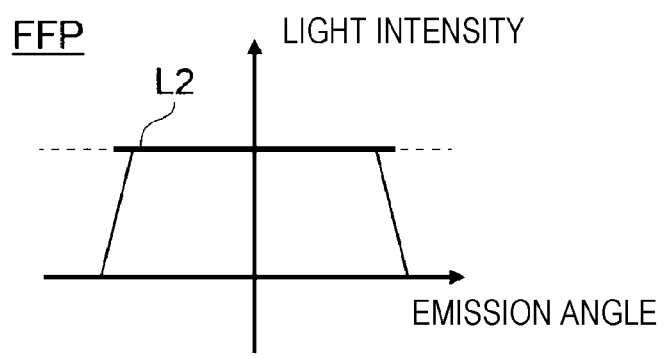
FIG. 8 is a third graph illustrating the observation results of the luminance distribution in the FFP.

FIG. 8 is a third graph illustrating the observation results of the luminance distribution in the FFP. Specifically, FIG. 8 illustrates the above observation results of the reflection light that is reflected on the human face to be returned, resulting from the irradiation light emitted from the light emitting apparatus 28.

As illustrated in FIG. 8, a solid line L2 representing a peak light intensity of the reflection light is a straight line extending in parallel to the horizontal axis of the graph, unlike the solid line L1 in FIG. 7 connecting the peak light intensity P1 and the peak light intensity P2 of the irradiation light to each other and having a bent center portion. In this manner, the peak light intensity of the reflection light is constant because, in the irradiation light from the light emitting apparatus 28, the irradiation light of the outer portion in the perpendicular direction that is perpendicular to the irradiation direction, specifically, the irradiation light from the VCSELs provided in the first regions 50, expands to decrease the light intensity.

Second Exemplary Embodiment

Next, a second exemplary embodiment will be described by omitting or briefly describing a repeated part of the other exemplary embodiments.

In a second exemplary embodiment, the irradiation light amount of the VCSELs provided in each of the regions of the first regions 50 has levels. Here, in the second exemplary embodiment, three levels are provided for the irradiation light amount of the VCSELs: a first level, a second level at which the irradiation light amount is smaller than that of the first level, and a third level at which the irradiation light amount is smaller than that of the second level.

In addition, in the second exemplary embodiment, the irradiation light amount of the VCSELs provided in the first regions 50A, 50D, 50G, and 50J located at corners in the first regions 50 is larger than the irradiation light amount of the VCSELs provided in the first regions 50B, 50C, 50E, 50F, 50H, and 50I located at places other than the corners (see FIGS. 3, 4, and 5). Specifically, the irradiation light amount of the VCSELs provided in the first regions 50A, 50D, 50G, and 50J is set to the first level, and the irradiation light amount of the VCSELs provided in the first regions 50B, 50C, 50E, 50F, 50H, and 50I is set to the second level. In addition, the irradiation light amount of the VCSELs provided in each of the regions in the second regions 55 is set to the third level.

Although omitted from the illustration, as an example, in the light emitting apparatus 28 in the second exemplary embodiment, the VCSELs whose irradiation light amount is set to the third level emit the irradiation light, then, the VCSELs whose irradiation light amount is set to the second level emit the irradiation light, and lastly, the VCSELs whose irradiation light amount is set to the first level emits the irradiation light.

With the above configuration, according to the second exemplary embodiment, variations in the reflection light amount from a human face that is the target object received by the 3D sensor 29 are suppressed as compared with a case where the irradiation light amounts of the VCSELs provided in the regions in the first regions 50 are substantially equal. In addition, according to the second exemplary embodiment, the variations in the reflection light amount from the human face that is the target object received by the 3D sensor 29 are suppressed as compared with a case where the irradiation light amount of the VCSELs provided in each of the regions located at corners in the first regions 50 is smaller than the irradiation light amount of the VCSELs provided in each of the regions located at places other than the corners when the regions are arranged two-dimensionally.

Third Exemplary Embodiment

Next, a third exemplary embodiment will be described by omitting or briefly describing a repeated part of the other exemplary embodiments.

Figure 9:
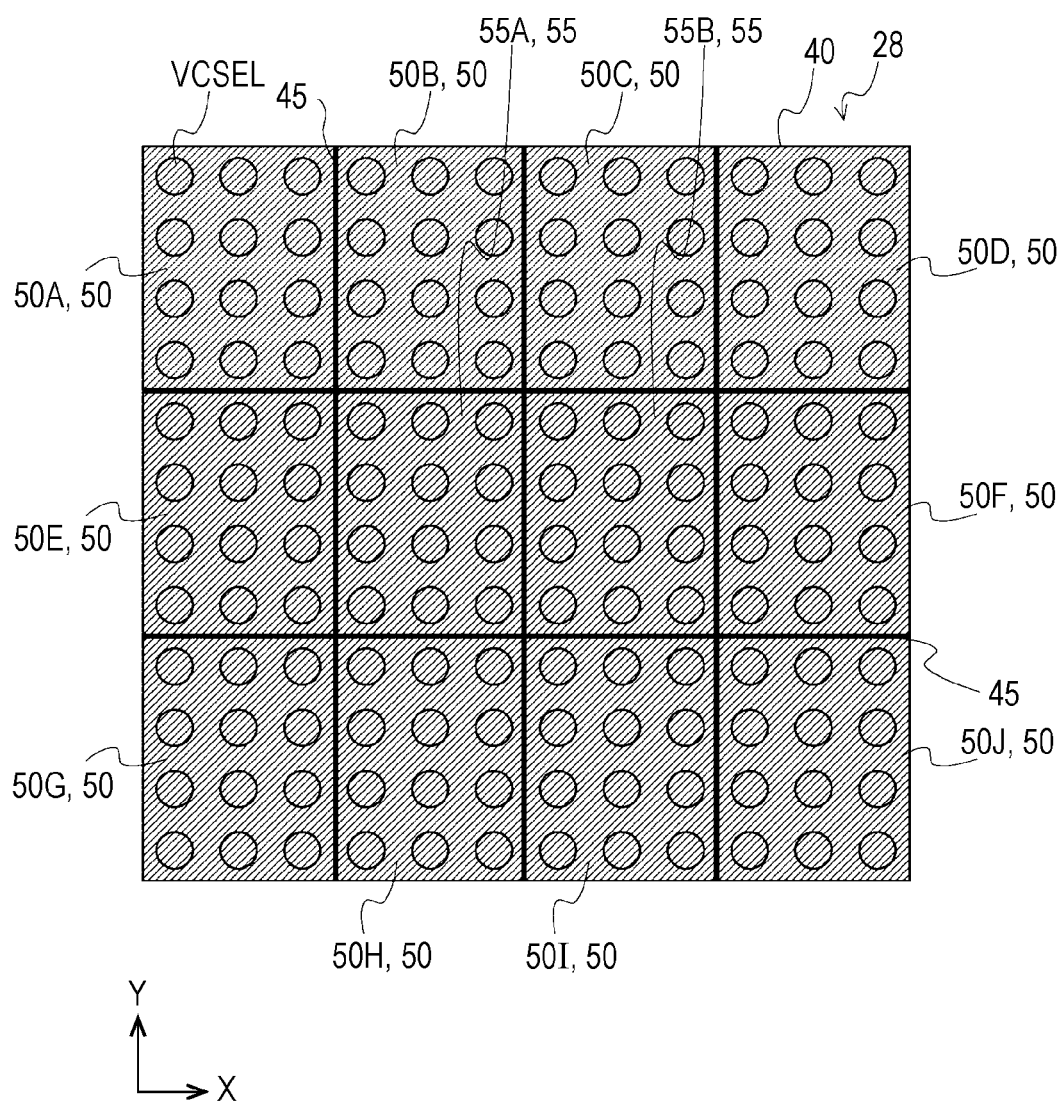
FIG. 9 is a fourth plan view of the light emitting apparatus.

FIG. 9 is a fourth plan view of the light emitting apparatus 28. Note that each region emitting the irradiation light is hatched with right-up diagonal lines in FIG. 9 as in FIGS. 4 and 5.

In the third exemplary embodiment, both the VCSELs provided in the first regions 50 and the VCSELs provided in the second regions 55 emit the irradiation light toward a human face at the same timing.

Here, as an example, in the third exemplary embodiment, plural drivers, which are not illustrated, are connected to the light emitting apparatus 28. In addition, in the light emitting apparatus 28 in the third exemplary embodiment, even if all of the VCSELs provided in the first regions 50 and the second regions 55 emit the irradiation light at the same timing, the value of the driving current that flows in the regions is changeable under control of the drivers. Thus, according to the third exemplary embodiment, while a difference is provided in the irradiation light amount of the VCSELs provided in the regions in the first regions 50 and the second regions 55, all of the VCSELs provided in the regions may emit the irradiation light toward a human face at the same timing.

Note that the method for providing a difference in the irradiation light amount of the VCSELs provided in the regions in the first regions 50 and the second regions 55 when all of the VCSELs provided in the regions emit the irradiation light at the same timing is not limited to connecting the plural drivers to the light emitting apparatus 28 as above. As another example of implementing the above method, when a thyristor is provided in the light emitting apparatus 28, one driver connected to the light emitting apparatus 28 may drive plural regions.

Fourth Exemplary Embodiment

Next, a fourth exemplary embodiment will be described by omitting or briefly describing a repeated part of the other exemplary embodiments.

Figure 10:
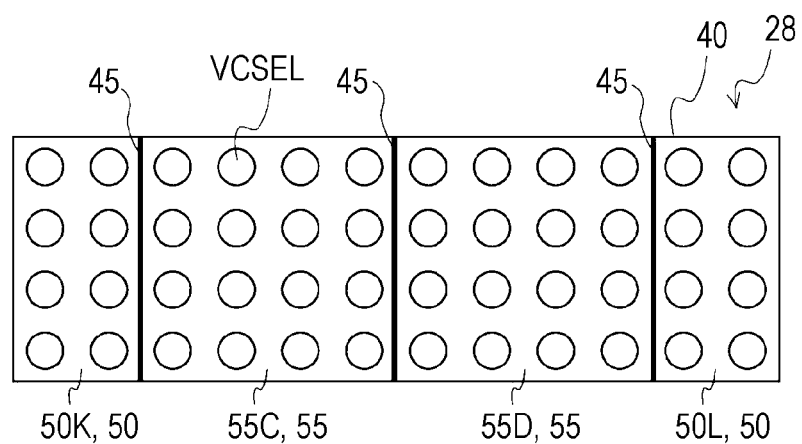
FIG. 10 is a fifth plan view of the light emitting apparatus.

FIG. 10 is a fifth plan view of the light emitting apparatus 28.

As illustrated in FIG. 10, in the light emitting apparatus 28 according to the fourth exemplary embodiment, regions that are isolated from each other to be arranged one-dimensionally in the X direction by the isolation trenches 45 are formed on the substrate 40. Specifically, the regions are isolated to four regions, which are a first region 50K, a second region 55C, a second region 55D, and a first region 50L in this order from the left. Note that the X direction in the fourth exemplary embodiment is an example of the "arrangement direction". In addition, when the regions are arranged one-dimensionally, the regions may be arranged not only in the X direction but also in the Y direction. In this case, the Y direction is an example of the "arrangement direction".

Here, in the fourth exemplary embodiment, areas of the above plural regions differ in accordance with the irradiation light amounts of the VCSELs provided in the regions. That is, in the fourth exemplary embodiment, an area difference is provided for the regions.

As an example, in the fourth exemplary embodiment, the area of each of the regions in the first regions 50 is smaller than the area of each of the regions in the second regions 55. Furthermore, in the fourth exemplary embodiment, a substantially equal amount of driving current flows in the regions in the first regions 50 and the second regions 55. In other words, in the fourth exemplary embodiment, the area of each of the regions is adjusted such that a substantially equal amount of driving current from the driver flows in the region, and, as a result, the area of each of the regions in the first regions 50 is smaller than the area of each of the regions in the second regions 55.

With the above configuration, according to the fourth exemplary embodiment, current is stably supplied to each of the regions as compared with a case where the amount of current that flows in each of the regions in the first regions 50 and the second regions 55 differs.

Others

In the information processing apparatus 20 according to the above exemplary embodiments, the irradiation light amount of the VCSELs provided in the first regions 50 is made larger than the irradiation light amount of the VCSELs provided in the second regions 55. However, without limitation to this, the irradiation light amount of the VCSELs provided in the first regions 50 and the irradiation light amount of the VCSELs provided in the second regions 55 may be changed depending on a processing content of the CPU 21 for determining the three-dimensional shape of the target object. Thus, the irradiation light is emitted toward the target object with an irradiation light amount in accordance with the processing content of the CPU 21. As an example, when the CPU 21 treats, as one image, images acquired in all light receiving regions included in the 3D sensor 29, as in the above exemplary embodiments, the irradiation light amount of the VCSELs provided in the first regions 50 may be made larger than the irradiation light amount of the VCSELs provided in the second regions 55. On the other hand, when the CPU 21 treats, as one image, each image acquired in a corresponding light receiving region included in the 3D sensor 29, the irradiation light amount of all VCSELs provided in the first regions 50 and the second regions 55 may be set to the first level, for example, without providing a light amount difference.

In the above exemplary embodiments, each of the plural VCSELs provided in each of the regions in the first regions 50 and the second regions 55 may emit the irradiation light toward a human face with a substantially equal irradiation light amount in the regions. That is, individual VCSELs provided in the first regions 50 may emit the irradiation light toward the human face with an equal irradiation light amount, and individual VCSELs provided in the second regions 55 may emit the irradiation light toward the human face with a substantially equal irradiation light amount. Thus, in the light emitting apparatus 28, irradiation control for each of the regions is easy as compared with a case where the VCSELs emit the irradiation light toward a human face with different irradiation light amounts in the regions.

In the above exemplary embodiments, an example of the target object is the "human face". However, without limitation to this, an example of the target object may also be another part of a human, such as a "hand" or a "foot", and may also be an object other than a human, such as a "car" or a "desk".

In the above exemplary embodiments, an example of a light emitting element is the "VCSEL". However, without limitation to this, an example of the light emitting element may also be a light emitting diode (LED), an edge emitting semiconductor laser, or the like.

The number of regions isolated on the substrate 40 and the number of VCSELs provided in each of the plural regions illustrated in the above exemplary embodiments are merely examples and may be smaller or larger than the above examples.

In the above exemplary embodiments, after the VCSELs provided in the second regions 55 emit the irradiation light toward a human face, the VCSELs provided in the first regions 50 emit the irradiation light toward the human face. However, the irradiation order is not limited to this, and, after the VCSELs provided in the first regions 50 emit the irradiation light toward the human face, the VCSELs provided in the second regions 55 may emit the irradiation light toward the human face.

In the above exemplary embodiments, the method of controlling the irradiation light amount of the VCSELs provided in each of the regions in the first regions 50 and the second regions 55 by the driver changing the value of the driving current to flow in the regions has been described. However, the method of controlling the irradiation light amount of the VCSELs provided in each of the regions is not limited to this and may be another method.

Figure 11:
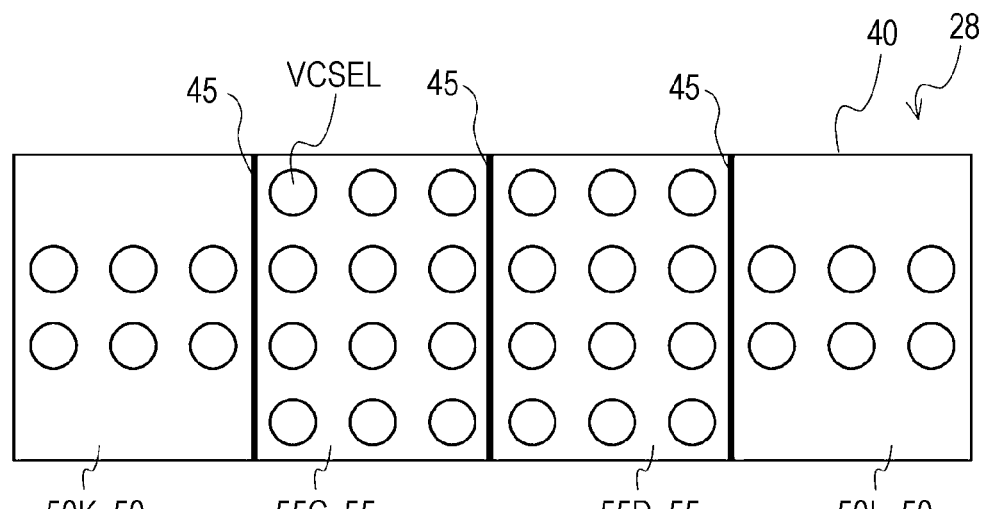
FIG. 11 is a sixth plan view of the light emitting apparatus.

As an example, when the driver flows the driving current with the same value to the regions in the first regions 50 and the second regions 55, the number of VCSELs provided in the regions may be changed so that a light amount difference may be provided in a manner that the irradiation light amount of the VCSELs provided in the first regions 50 is larger than the irradiation light amount of the VCSELs provided in the second regions 55. In this case, as illustrated in FIG. 11, the number of VCSELs provided in the first regions 50 (example: 6) may be made smaller than the number of VCSELs provided in the second regions 55 (example: 12). However, without limitation to this, when the number of VCSELs provided in the first regions 50 is made larger than the number of VCSELs provided in the second regions 55, any configuration described in the above exemplary embodiments and Others may be used as appropriate so that a light amount difference may be provided in a manner that the irradiation light amount of the VCSELs provided in the first regions 50 is larger than the irradiation light amount of the VCSELs provided in the second regions 55.

Figure 12:
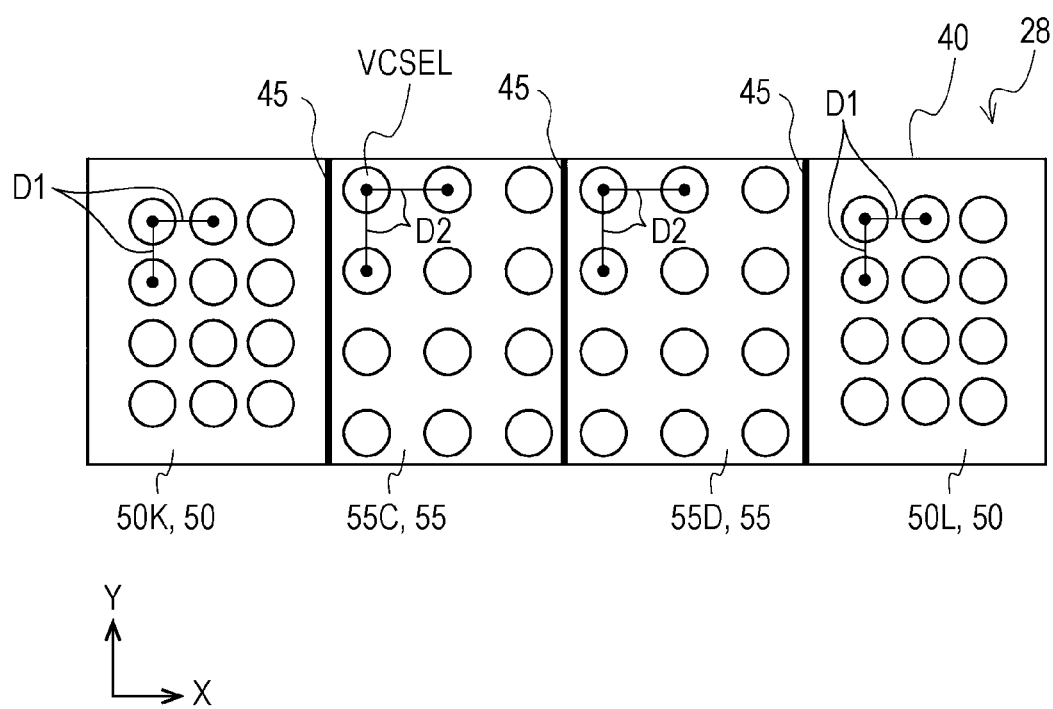
FIG. 12 is a seventh plan view of the light emitting apparatus.

In addition, when the driver flows the driving current with the same value to the regions in the first regions 50 and the second regions 55, the density of light emission points in the regions, that is, the interval between the VCSELs, may be changed so that a light amount difference may be provided in a manner that the irradiation light amount of the VCSELs provided in the first regions 50 is larger than the irradiation light amount of the VCSELs provided in the second regions 55. In this case, as illustrated in FIG. 12, an interval D1 between adjacent VCSELs provided in the first regions 50 may be made smaller than an interval D2 between adjacent VCSELs provided in the second regions 55. However, without limitation to this, when the interval D1 between adjacent VCSELs provided in the first regions 50 is made larger than the interval D2 between adjacent VCSELs provided in the second regions 55, any configuration described in the above exemplary embodiments and Others may be used as appropriate so that a light amount difference may be provided in a manner that the irradiation light amount of the VCSELs provided in the first regions 50 is larger than the irradiation light amount of the VCSELs provided in the second regions 55.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light emitting apparatus comprising:
   a substrate; and
   light emitting elements including at least one light emitting element that is provided, on the substrate, in each region of a plurality of regions and that emits irradiation light toward a target object, the regions including a first region and a second region and being isolated from each other to be arranged one-dimensionally or two-dimensionally, wherein:
   in the plurality of regions, an irradiation light amount of at least one light emitting element provided in the first region that is a region located at an end in an arrangement direction is larger than an irradiation light amount of at least one light emitting element provided in the second region that is a region located at a place other than the end in the arrangement direction,
   wherein a number of light emitting elements disposed in the first region is less than a number of light emitting elements disposed in the second region, and an amount of current provided to the first region is equal to an amount of current provided to the second region.

2. The light emitting apparatus according to claim 1, wherein the plurality of regions are isolated from each other by a trench formed on the substrate.

3. The light emitting apparatus according to claim 1, wherein the irradiation light amount of the at least one light emitting element provided in the first region has a plurality of levels.

4. The light emitting apparatus according to claim 3, wherein, when the plurality of regions are isolated from each other to be arranged two-dimensionally on the substrate, the irradiation light amount of at least one light emitting element provided at a corner in the first region is larger than the irradiation light amount of at least one light emitting element provided at a place other than the corner in the first region.

5. The light emitting apparatus according to claim 1, wherein the plurality of regions have different areas in accordance with irradiation light amounts of the light emitting elements provided in the plurality of regions.

6. The light emitting apparatus according to claim 5, wherein:
the first region has a smaller area than the second region, and
a substantially equal amount of current flows in the first region and the second region.

7. The light emitting apparatus according to claim 1, wherein, after one of the at least one light emitting element provided in the first region or the at least one light emitting element provided in the second region emits the irradiation light toward the target object, another one of the at least one light emitting element provided in the first region or the at least one light emitting element provided in the second region emits the irradiation light toward the target object.

8. The light emitting apparatus according to claim 1, wherein both the at least one light emitting element provided in the first region and the at least one light emitting element provided in the second region emit the irradiation light toward the target object at an identical timing.

9. The light emitting apparatus according to claim 1, wherein:
the at least one light emitting element provided in each region of the plurality of regions includes a plurality of light emitting elements; and
each of the plurality of light emitting elements in a corresponding region of the plurality of regions emits the irradiation light toward the target object with a substantially equal irradiation light amount.

10. An information processing apparatus comprising:
the emitting apparatus according to claim 1;
a light receiving unit that receives reflection light, the reflection light being light emitted from the at least one light emitting element included in the light emitting apparatus and reflected on the target object; and
a determination unit that determines a three-dimensional shape of the target object by using the reflection light received by the light receiving unit.

11. The information processing apparatus according to claim 10, wherein, depending on a processing content, the determination unit for determining the three-dimensional shape of the target object, the irradiation light amount of the at least one light emitting element provided in the first region and the irradiation light amount of the at least one light emitting element provided in the second region are changed in the light emitting apparatus.

12. The light emitting apparatus according to claim 1, wherein a size of the first region is same as a size of the second region, and the number of light emitting elements disposed in the first region is less than the number of light emitting elements disposed in the second region.

* * * * *